(12) United States Patent
Kobayakawa et al.

(10) Patent No.: US 11,605,765 B2
(45) Date of Patent: Mar. 14, 2023

(54) LED MODULE

(71) Applicant: Rohm Co., Ltd., Kyoto (JP)

(72) Inventors: Masahiko Kobayakawa, Kyoto (JP); Tomoichiro Toyama, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 164 days.

(21) Appl. No.: 16/556,896

(22) Filed: Aug. 30, 2019

(65) Prior Publication Data

US 2019/0386190 A1 Dec. 19, 2019

Related U.S. Application Data

(63) Continuation of application No. 15/634,602, filed on Jun. 27, 2017, now abandoned, which is a (Continued)

(30) Foreign Application Priority Data

Apr. 9, 2010 (JP) .................................. 2010-090712

(51) Int. Cl.
*H01L 33/60* (2010.01)
*H01L 25/075* (2006.01)
(Continued)

(52) U.S. Cl.
CPC .......... *H01L 33/60* (2013.01); *H01L 25/0753* (2013.01); *H01L 33/62* (2013.01); *H01L 24/73* (2013.01); *H01L 33/486* (2013.01); *H01L 2224/32225* (2013.01); *H01L 2224/48227* (2013.01); *H01L 2224/48465* (2013.01); *H01L 2224/49107* (2013.01); *H01L 2224/49113* (2013.01); *H01L 2224/73265* (2013.01); *H01L 2924/01322* (2013.01)

(58) Field of Classification Search
None
See application file for complete search history.

(56) References Cited

U.S. PATENT DOCUMENTS 7,399,658 B2 7/2008 Shim et al.
7,815,343 B2 10/2010 Nii et al.
(Continued)

FOREIGN PATENT DOCUMENTS

JP 7-199829 A 8/1995
JP 2003-264267 A 9/2003
(Continued)

OTHER PUBLICATIONS

Office Action issued in counterpart Japanese Patent Application No. 2012-509720 dated Sep. 8, 2015 (3 pages).

*Primary Examiner* — Michelle Mandala
*Assistant Examiner* — Jordan M Klein
(74) *Attorney, Agent, or Firm* — Hamre, Schumann, Mueller & Larson, P.C.

(57) ABSTRACT

An LED module according to the present invention includes an LED unit 2 and a case 1, where the LED unit includes an LED chip 21, and the case 1 includes a main body 11 made of a ceramic material and a pad 12a on which the LED unit 2 is mounted. The outer edge 121a of the pad 12a is positioned inward of the outer edge 2a of the LED unit 2 as viewed in plan. These arrangements prevent the light emission amount of the LED module A1 from reducing with time.

18 Claims, 11 Drawing Sheets

Related U.S. Application Data continuation of application No. 13/638,248, filed as application No. PCT/JP2011/059014 on Apr. 11, 2011, now Pat. No. 9,722,157.

(51) Int. Cl.
*H01L 33/62* (2010.01)
*H01L 33/48* (2010.01)
*H01L 23/00* (2006.01)

(56) References Cited

U.S. PATENT DOCUMENTS

| | | | |
|---|---|---|---|
| 8,614,544 | B2 | 12/2013 | Suzuki et al. |
| 2002/0160552 | A1 | 10/2002 | Minamio et al. |
| 2003/0038378 | A1 | 2/2003 | Jacobs |
| 2004/0079957 | A1* | 4/2004 | Andrews ............... H01L 33/52 257/E33.072 |
| 2004/0208210 | A1* | 10/2004 | Inoguchi ............ H01L 25/0753 257/E33.072 |
| 2005/0139846 | A1* | 6/2005 | Park ................... H01L 33/62 438/22 |
| 2005/0156187 | A1 | 7/2005 | Isokawa et al. |
| 2005/0173708 | A1* | 8/2005 | Suehiro ............... H01L 33/56 257/E33.059 |
| 2006/0091416 | A1 | 5/2006 | Yan |
| 2006/0186430 | A1 | 8/2006 | Park et al. |
| 2007/0085101 | A1* | 4/2007 | Kim .................... H01L 33/52 257/E33.072 |
| 2007/0221940 | A1 | 9/2007 | Okazaki |
| 2007/0272938 | A1* | 11/2007 | Maeda ................. H01L 33/486 257/E33.072 |
| 2008/0067534 | A1* | 3/2008 | Hsieh .................. H01L 33/64 257/E33.072 |
| 2008/0225449 | A1 | 9/2008 | Inoue et al. |
| 2009/0207580 | A1 | 8/2009 | Oshika et al. |
| 2009/0209064 | A1 | 8/2009 | Nonahasitthichai et al. |
| 2010/0044747 | A1 | 2/2010 | Tanaka |
| 2010/0072496 | A1 | 3/2010 | Kobayakawa |
| 2010/0090239 | A1* | 4/2010 | Lin ..................... H01L 33/486 438/27 |
| 2010/0123162 | A1 | 5/2010 | Kondo et al. |
| 2010/0127300 | A1 | 5/2010 | Lee et al. |
| 2010/0128461 | A1 | 5/2010 | Kim et al. |
| 2010/0224890 | A1 | 9/2010 | Keller et al. |
| 2010/0277919 | A1 | 11/2010 | Okada et al. |
| 2011/0220939 | A1* | 9/2011 | Nakayama ............ H01L 33/44 257/E33.068 |

FOREIGN PATENT DOCUMENTS

| | | |
|---|---|---|
| JP | 2005-167174 A | 6/2005 |
| JP | 2006-156603 A | 6/2006 |
| JP | 2006-237141 A | 7/2006 |
| JP | 2006-286944 A | 10/2006 |
| JP | 2006-324317 A | 11/2006 |
| JP | 2006-324392 A | 11/2006 |
| JP | 2007-258420 A | 10/2007 |
| JP | 2008-41917 A | 2/2008 |
| JP | 2008-47834 A | 2/2008 |
| JP | 2008-270327 A | 11/2008 |

* cited by examiner

LED MODULE

TECHNICAL FIELD

The present invention relates to an LED module provided with an LED chip as the light source.

BACKGROUND ART

FIG. 19 shows an example of conventional LED module (see e.g. Patent Document 1). The LED module X illustrated in the figure includes a case 91, a sub-mount substrate 92, a wiring pattern 93, an LED chip 94 and a light-transmitting portion 95. The case 91 is made of e.g. resin. The sub-mount substrate 92 is made of e.g. Si. The wiring pattern 93 is formed on the sub-mount substrate 92 and has an obverse surface made of e.g. Au or Ag. The LED chip 94 is the light source of the LED module X and emits light of a predetermined wavelength. The LED chip 94 is mounted to the sub-mount substrate 92 by eutectic bonding to the wiring pattern 93. The light-transmitting portion 95 is made of a material that transmits light from the LED chip 94, such as silicone resin, and covers the LED chip 94.

After long use of the LED module X, the material such as Ag that forms the obverse surface of the wiring pattern 93 is corroded and changes to a dark color. The wiring pattern 93 that has changed to a dark color in this way absorbs light emitted from the LED chip 94. Thus, the amount of light emission from the LED module X may reduce with time.
Patent Document 1: JP-A-2006-237141

SUMMARY OF THE INVENTION

Problems to be Solved by the Invention

The present invention has been conceived in view of the above-described situation, and it is an object of the present invention to provide an LED module that is configured to suppress reduction of light emission with time.

Means for Solving the Problems

An LED module provided according to a first aspect of the present invention comprises: at least one LED unit including an LED chip; and a case including a main body made of a ceramic material and at least one pad for mounting the LED unit. The pad includes an outer edge that is positioned inward of the outer edge of the LED unit as viewed in plan.

According to a second aspect of the present invention, in the LED module of the first aspect, the pad includes an obverse surface made of Ag or Au.

According to a third aspect of the present invention, in the LED module of the first or the second aspect, the main body is white.

According to a fourth aspect of the present invention, the LED module of anyone of the first through the third aspects further comprises at least one wire including an end bonded to the LED unit. The case further comprises at least one bonding pad to which another end of the wire is bonded and which is positioned on the outer side of the pad as viewed in plan.

According to a fifth aspect of the present invention, in the LED module of anyone of the first through the fourth aspects, the main body further comprises a reflector surrounding the LED unit, and the reflector is provided with a recess that accommodates at least a part of the bonding pad as viewed in plan.

According to a sixth aspect of the present invention, in the LED module of any one of the first through the fifth aspects, the case further comprises: at least one mounting electrode provided on an opposite side from the pad; and a penetration conductor penetrating the main body and connecting one of the pads and one of the mounting electrodes to each other.

According to a seventh aspect of the present invention, in the LED module of any one of the first through the sixth aspects, the LED unit consists of the LED chip only.

According to an eighth aspect of the present invention, in the LED module of any one of the first through the sixth aspects, the LED unit further comprises a sub-mount substrate on which the LED chip is mounted.

According to a ninth aspect of the present invention, in the LED module of any one of the first through the eighth aspects, the above-mentioned pad comprises a plurality of pads arranged in a plurality of rows, and the above-mentioned LED unit comprises a plurality of LED units mounted on the plurality of pads, respectively.

According to a tenth aspect of the present invention, in the LED module of anyone of the first through the ninth aspects, the LED unit and the pad are bonded to each other by eutectic bonding.

According to an eleventh aspect of the present invention, the LED module of anyone of the first through the tenth aspects further comprises a light-transmitting portion covering the LED unit. The light-transmitting portion is made up of a resin material and a fluorescent substance, where the resin material is configured to transmit light from the LED unit, and the fluorescent substance is configured to be excited by the light from the LED unit, thereby emitting light of a wavelength different from that of the light from the LED unit.

Other features and advantages of the present invention will become more apparent from detailed description given below with reference to the accompanying drawings.

MODE FOR CARRYING OUT THE INVENTION

Figure 1:
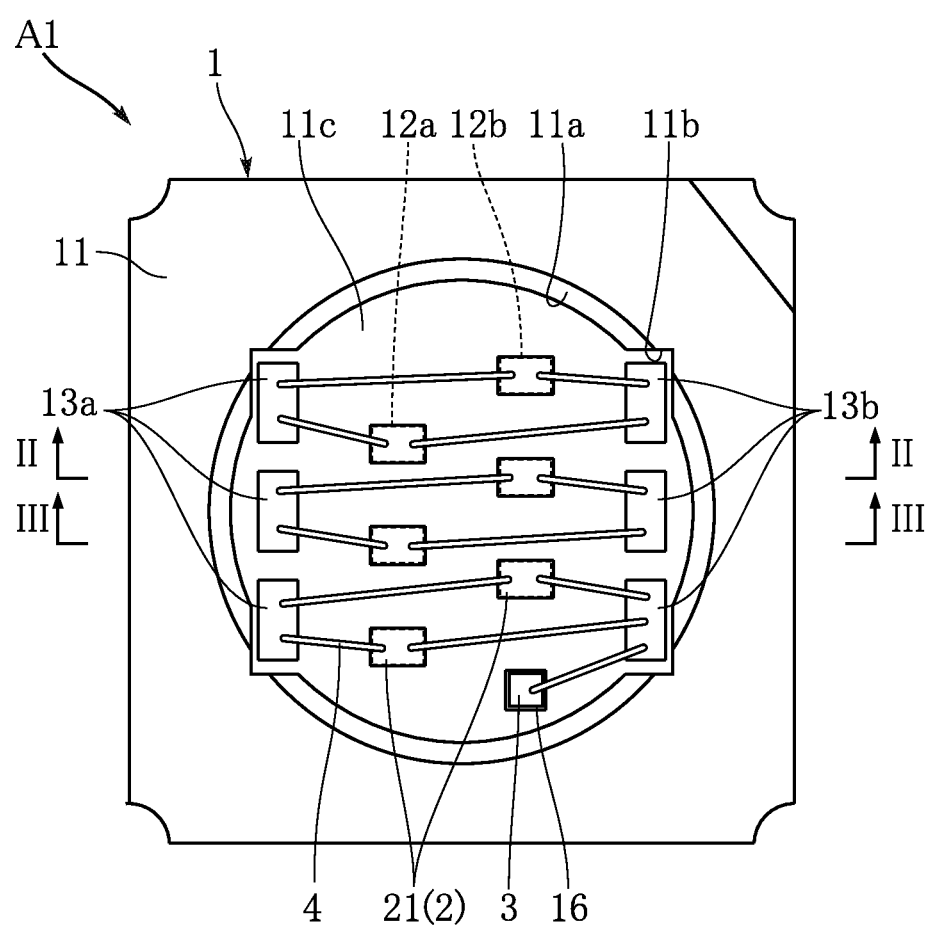
FIG. 1 is a plan view showing an LED module according to a first embodiment of the present invention.
Figure 2:
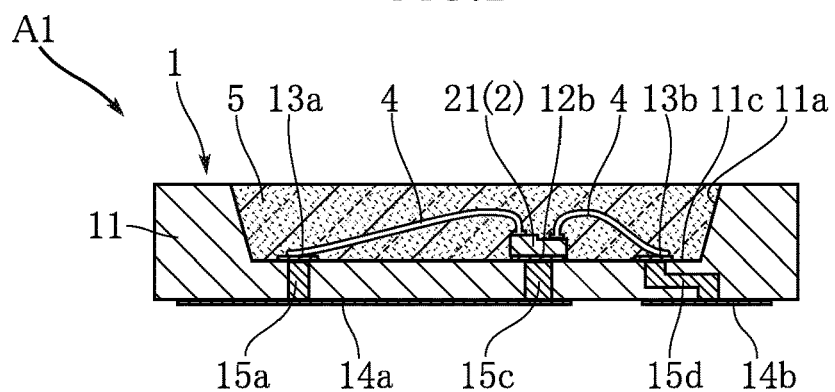
FIG. 2 is a sectional view taken along lines II-II in FIG. 1.
Figure 3:
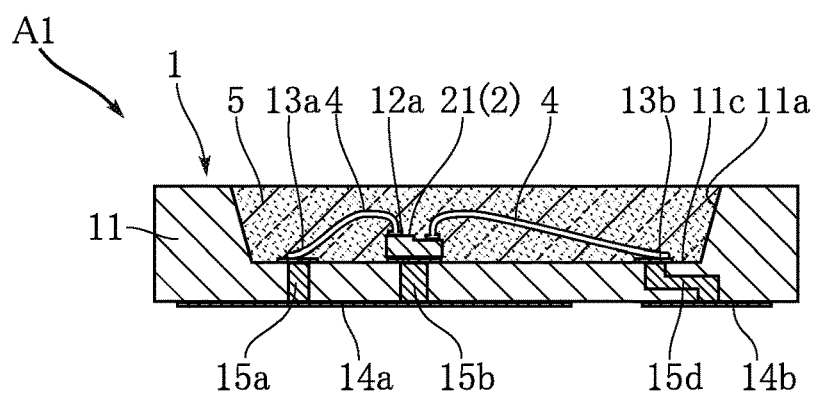
FIG. 3 is a sectional view taken along lines III-III in FIG. 1.

Preferred embodiments of the present invention are described below with reference to the accompanying drawings.

FIGS. 1-5 show an example of LED module according to the present invention. The LED module A1 of this embodiment includes a case 1, a plurality of LED units 2, a Zener diode 3, wires 4 and a light-transmitting portion 5 (not shown in FIG. 1). The LED module A1 is an LED module of a high output type that provides a relatively high brightness and is about 5 mm×5 mm as viewed in plan and about 0.9 mm in thickness.

The case 1 includes a main body 11, a plurality of pads 12a and 12b, a plurality of bonding pads 13a and 13b, a pad 16, a pair of mounting electrodes 14a and 14b, and a plurality of penetration conductors 15a, 15b, 15c and 15d. The case 1 is made of a white ceramic material such as alumina. The main body 11 has a reflector 11a and a bottom surface 11c. The reflector 11a reflects the light traveling generally horizontally from the LED chip 21 in FIG. 2 to direct the light upward in the figure. In this embodiment, the reflector 11a is provided with four recesses 11b. Each of the four recesses 11b has a triangular cross section as viewed in plan and reaches the bottom surface 11c. The bottom surface 11c is generally circular and connected to the bottom edge of the reflector 11a.

The pads 12a and 12b are formed on the bottom surface 11c. In this embodiment, three pads 12a and three pads 12b are arranged in two rows. Each of the pads 12a, 12b is rectangular and made of a plurality of plated layers laminated from the bottom surface 11c side in the order of e.g. Ag, Ni, Au or Ag, Ni, Ag or W, Ni, Ag or W, Ni, Au. When the top layer is made of Ag, the Ag layer is made to have a thickness of about 2.5 μm. When the top layer is made of Au, the Au layer is made to have a thickness of about 0.1 μm.

The bonding pads 13a, 13b are formed on the bottom surface 11c. In this embodiment, three bonding pads 13a and three bonding pads 13b are arranged in two rows. Each of the bonding pads 13a, 13b is rectangular and made of plated layers similar to those of the pads 12a, 12b. About one third of each of the four bonding pads 13a, 13b positioned at four corners is accommodated in a respective one of the four recesses 11b.

The pad 16 is arranged adjacent to the edge of the bottom surface 11c and made of plated layers similar to those of the pads 12 and the bonding pads 13.

Figure 4:
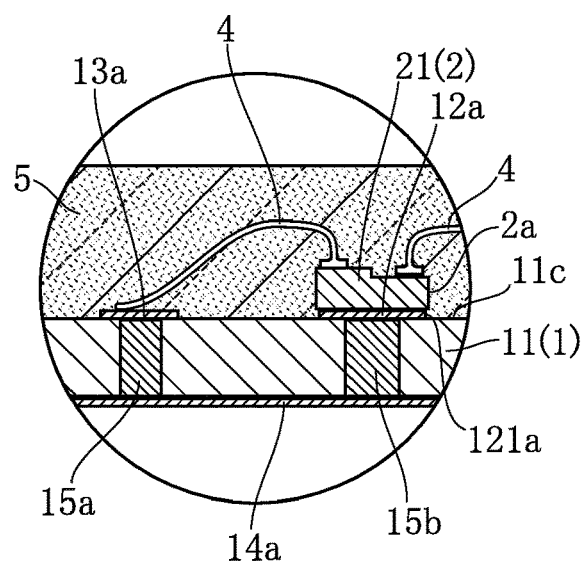
FIG. 4 is an enlarged sectional view of a principal portion of the LED module according to the first embodiment of the present invention.
Figure 5:
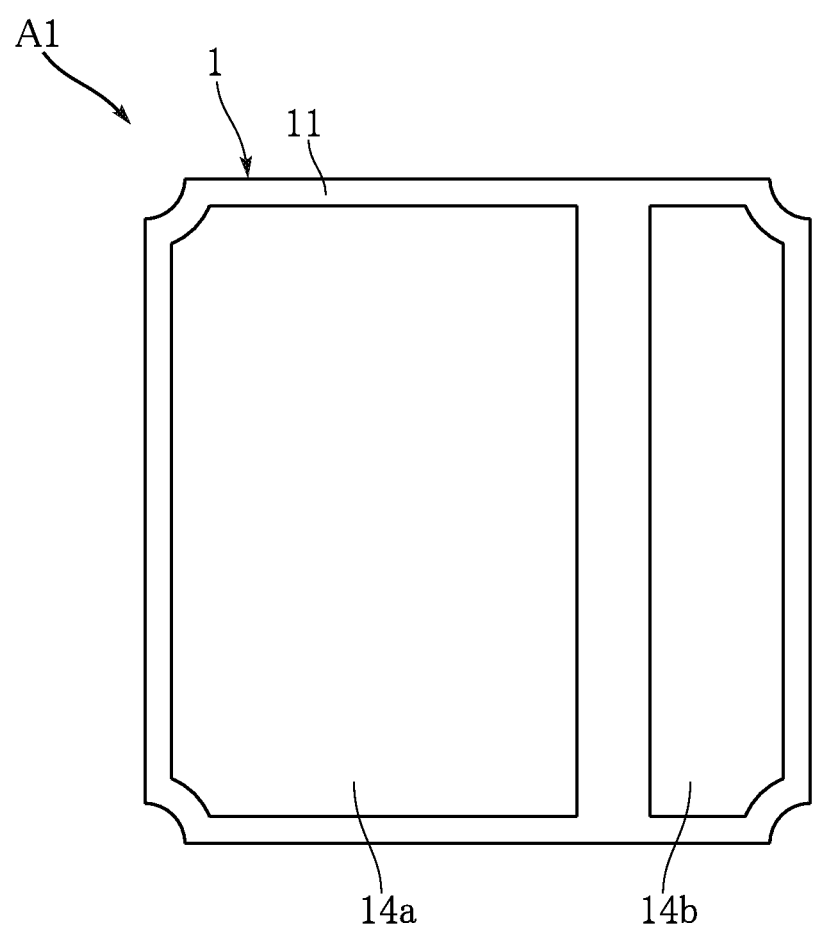
FIG. 5 is a bottom view of the LED module according to the first embodiment of the present invention.
Figure 6:
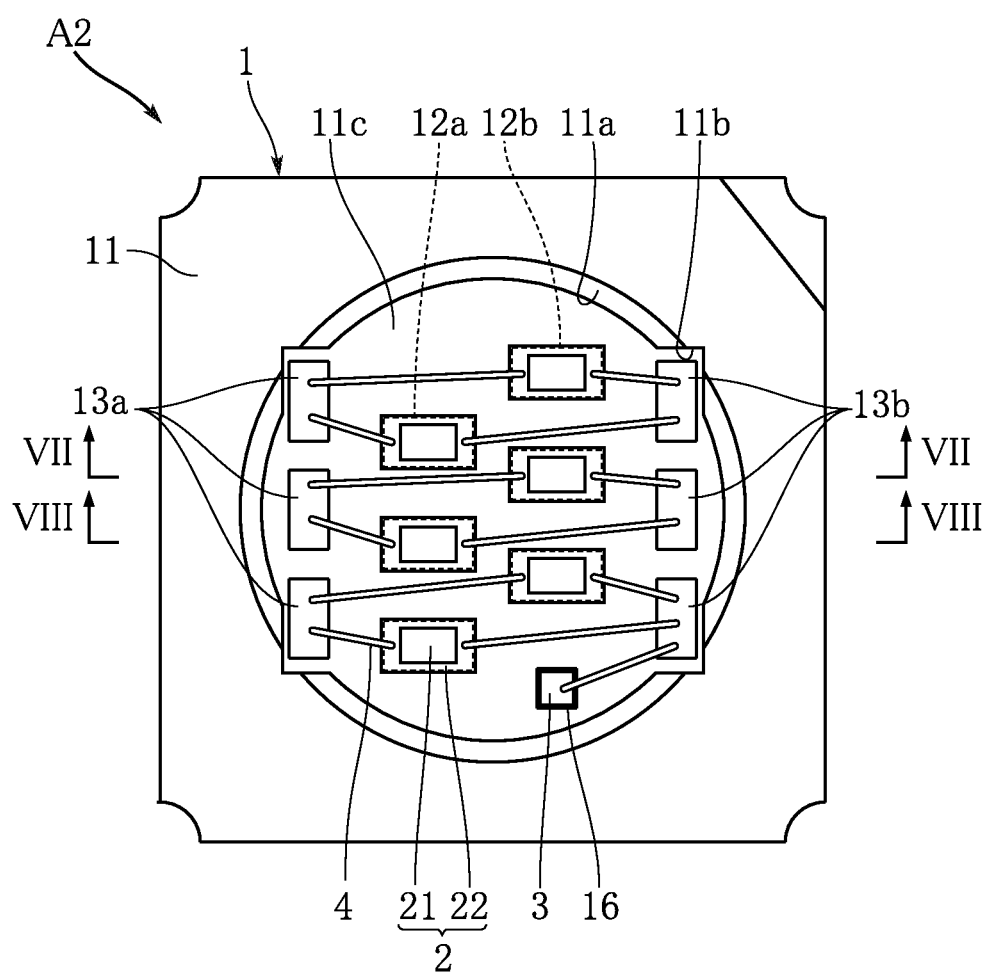
FIG. 6 is a plan view showing an LED module according to a second embodiment of the present invention.
Figure 7:
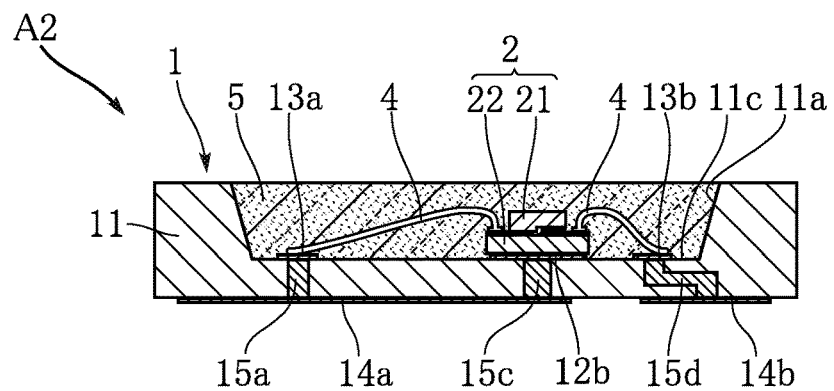
FIG. 7 is a sectional view taken along lines VII-VII in FIG. 6.
Figure 8:
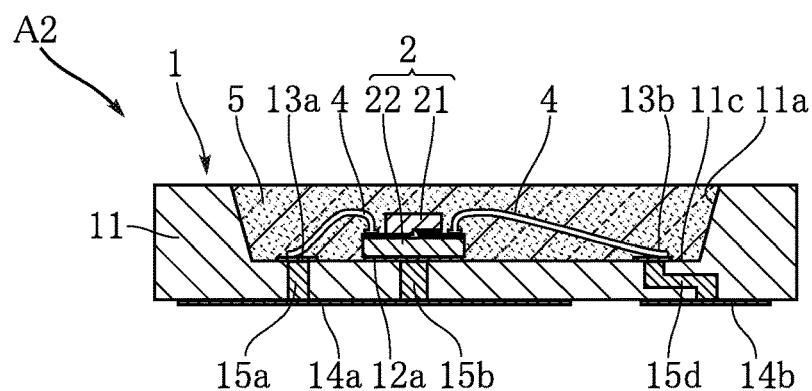
FIG. 8 is a sectional view taken along lines VIII-VIII in FIG. 6.

As shown in FIG. 4, the paired mounting electrodes 14a and 14b are generally rectangular and formed on a surface of the main body 11 opposite from the surface provided with the reflector 11a and the bottom surface 11c. As shown in the figure, the mounting electrode 14a is considerably larger than the mounting electrode 14b and overlaps the LED chips 21 as viewed in plan.

The penetration conductors 15a, 15b, 15c and 15d are made of e.g. Ag or W and penetrate the main body 11. In this embodiment, three penetration conductors 15a connect the three bonding pads 13a to the mounting electrode 14a. Three penetration conductors 15b connect the three pads 12a to the mounting electrode 14a. Three penetration conductors 15c connect the three pads 12b to the mounting electrode 14a. The single penetration conductor 15c connects the pad 16 to the mounting electrode 14a. Three penetration conductors 15d connect the three bonding pad 13b to the mounting electrode 14b and are in the form of a crank.

The case 1 having this structure can be made by laminating a ceramic material, an Ag material or a W material in an appropriate order, then baking these materials, and then performing plating.

The LED units 2 are the light source of the LED module A1 and comprise a plurality of LED chips 21 in this embodiment. Each LED chip 21 includes an n-type semiconductor layer made of e.g. GaN-based semiconductor, a p-type semiconductor layer, and an active layer sandwiched between these layers, and emits blue light. The LED chips 21 are bonded to the pads 12a, 12b by eutectic bonding. The size of each LED chip 21 as viewed in plan is larger than that of each pad 12a, 12b. That is, as shown in FIG. 4, the outer edge 121a of each pad 12a is positioned slightly inward of the outer edge 2a of the LED unit 2 (LED chip 21) as viewed in plan. This holds true for the outer edge of each pad 12b. In this embodiment, the LED chips 21 are configured as a two-wire LED chip.

The Zener diode 3 prevents application of excessive reverse voltage to the LED chips 21 and allows current to flow in a reverse direction only when an excessive reverse voltage above a certain value is applied. The Zener diode 3 is bonded to the pad 16 via e.g. Ag paste.

The wires 4 are made of e.g. Au. Each of the wires 4 is bonded at one end to the bonding pad 13a or 13b and bonded at the other end to one of the LED chips 21 or the Zener diode 3.

The light-transmitting portion 5 fills the region surrounded by the reflector 11a and the bottom surface 11c and covers the LED chips 21, the Zener diode 3 and the wires 4. The light-transmitting portion 5 is made of e.g. transparent silicone resin with a fluorescent substance mixed in it. For instance, the fluorescent substance emits yellow light when excited by the blue light from the LED chips 21. The yellow light mixes with the blue light from the LED chips 21, whereby white light is emitted from the LED module A1. Instead of such a fluorescent substance, use may be made of a fluorescent substance that emits red light when excited by blue light and a fluorescent material that emits green light when excited by blue light.

The advantages of the LED module A1 are described below.

According to this embodiment, the pads 12a, 12b are covered by the LED chips 21. Thus, even when the pads 12a, 12b change to a dark color with time, light from the LED chips 21 traveling toward the bottom surface 11c is not absorbed by the pads 12a, 12b but reflected by the bottom surface 11c. Thus, reduction of light emission amount of the LED module with time is suppressed, and the LED module A1 offers high brightness.

Although the bonding pads 13a, 13b are not completely covered by the LED chips 21 or the wires 4, the bonding pads 13a, 13b are provided on the outer side of the LED chips 21 and spaced apart from the LED chips 21. This prevents light from the LED chips 21 from being absorbed by the bonding pad 13a, 13b.

The provision of the recesses 11b in the reflector 11a allows the reflector 11a to be arranged relatively close to the LED chips 2. Such an arrangement is suitable for increasing the brightness of the LED module A1. The main body 11, which is made of a ceramic material, can transmit light from the LED chips 21, though the amount is small. Arranging the reflector 11a relatively close to LED chips 21 allows the size of the portion of the main body 11 which is on the outer side of the reflector 11a to be increased without changing the outer dimensions of the main body 11. Thus, unfavorable leak of the light from the LED chips 21 to the sides through the main body 11 is prevented.

The penetration conductors 15b, 15c do not carry out electrical function but conduct the heat generated at the LED chips 21 from the pads 12a, 12b to the mounting electrode 14a. With this arrangement, heat is efficiently dissipated from the LED chips 21, which makes it possible to apply high current to the LED chips 21. This is advantageous for increasing the brightness of the LED module A1.

FIGS. 6-18 show other embodiments of the present invention. In these figures, the elements that are identical or similar to those of the foregoing embodiment are designated by the same reference signs as those used for the foregoing embodiment.

FIGS. 6-9 show an LED module according to a second embodiment of the present invention. The LED module A2 of this embodiment is different from the foregoing embodiment in structure of the LED units 2. Specifically, in this embodiment, each LED unit 2 comprises an LED chip 21 and a sub-mount substrate 22.

Figure 9:
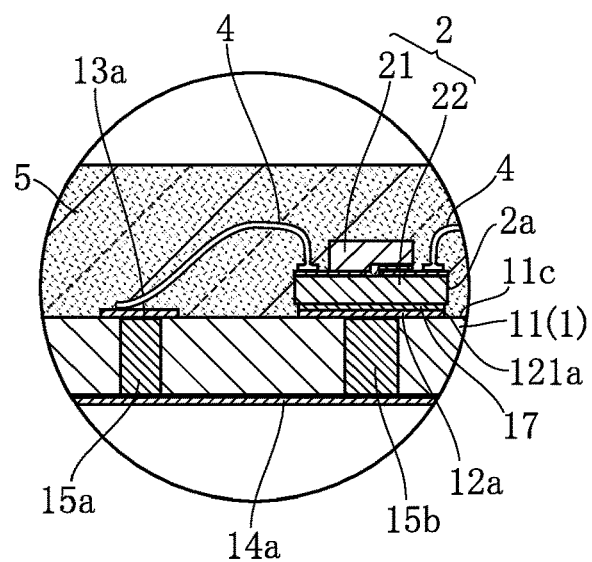
FIG. 9 is an enlarged sectional view of a principal portion of the LED module according to the second embodiment of the present invention.
Figure 10:
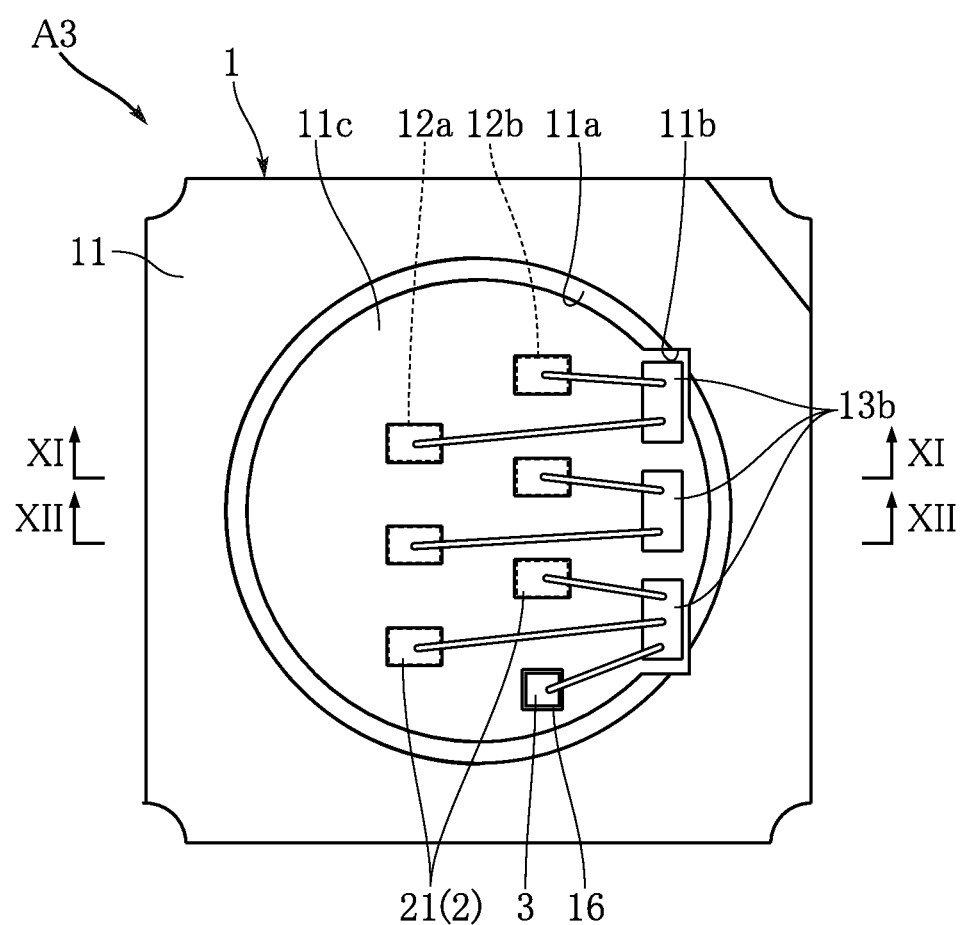
FIG. 10 is a plan view showing an LED module according to a third embodiment of the present invention.
Figure 11:
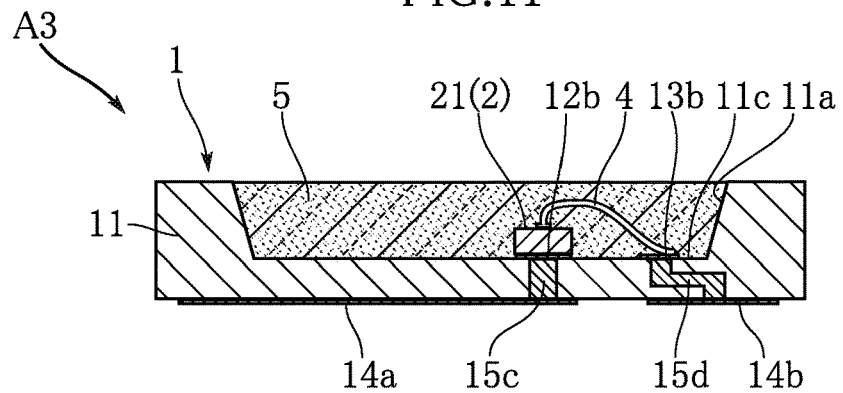
FIG. 11 is a sectional view taken along lines XI-XI in FIG. 10.
Figure 12:
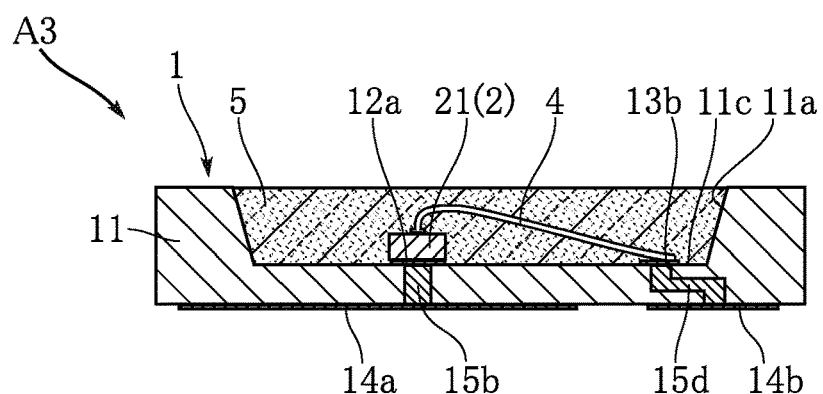
FIG. 12 is a sectional view taken along lines XII-XII in FIG. 10.

The sub-mount substrate 22 is made of e.g. Si, and the LED chip 21 is mounted on the sub-mount substrate. The sub-mount substrate 22 has a wiring pattern formed on it. The wiring pattern is electrically connected to an electrode (not shown) of the LED chip 21, and includes a portion extending into a region that is not covered by the LED chip 21. In this embodiment, wires 4 are bonded to the wiring pattern. As shown in FIG. 9, the sub-mount substrate 22 is bonded to the pad 12a or 12b with e.g. Ag paste 17. This bonding may be performed by eutectic bonding.

The size of each pad 12a, 12b as viewed in plan is smaller than that of the sub-mount substrate 22. As shown in FIG. 9, the outer edge 121a of each pad 12a is positioned slightly inward of the outer edge 2a of the LED unit 2 (sub-mount substrate 22) as viewed in plan. This holds true for the outer edge of each pad 12b.

According to this embodiment again, reduction of light emission amount of the LED module with time is suppressed, and the LED module A2 offers high brightness.

FIGS. 10-13 show an LED module according to a third embodiment of the present invention. The LED module A3 of this embodiment is different from the foregoing embodiments in structure of the LED units 2. Specifically, in this embodiment, each LED unit 2 consists of an LED chip 21 only and is structured as a single-wire LED unit. Since each LED unit 2 is a single-wire LED unit, the bonding pads 13a and the penetration conductors 15, which are provided in the cases 1 of the LED modules A1 and A2, are not provided in this embodiment.

In this embodiment, electrodes (not shown) are formed on the upper surface and the lower surface of each LED chip 21. To the electrode on the upper surface is bonded a wire 4. The electrode on the lower surface is bonded to the pad 12a or 12b by e.g. eutectic bonding.

Figure 13:
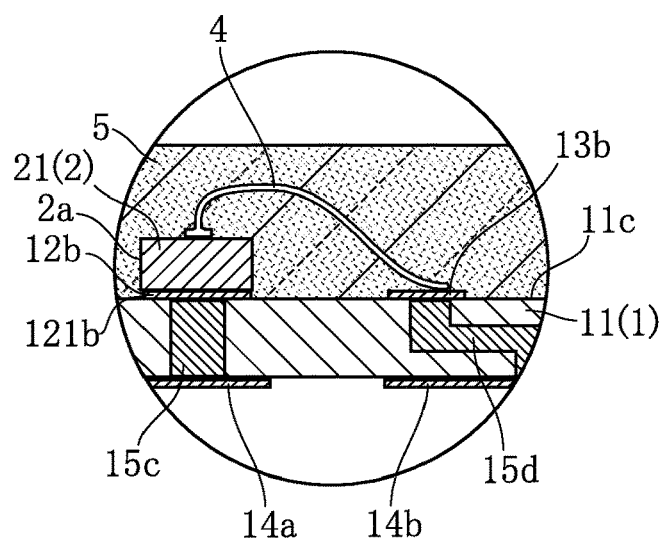
FIG. 13 is an enlarged sectional view of a principal portion of the LED module according to the third embodiment of the present invention.
Figure 14:
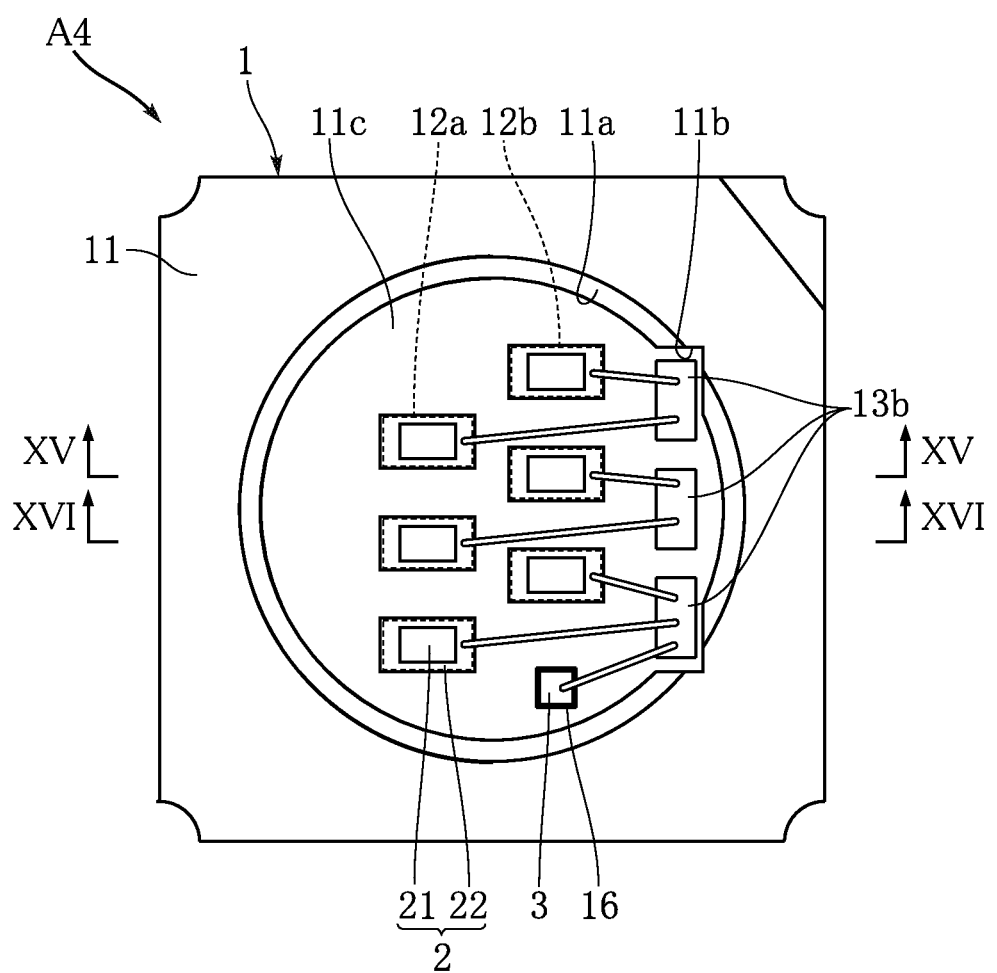
FIG. 14 is a plan view showing an LED module according to a fourth embodiment of the present invention.
Figure 15:
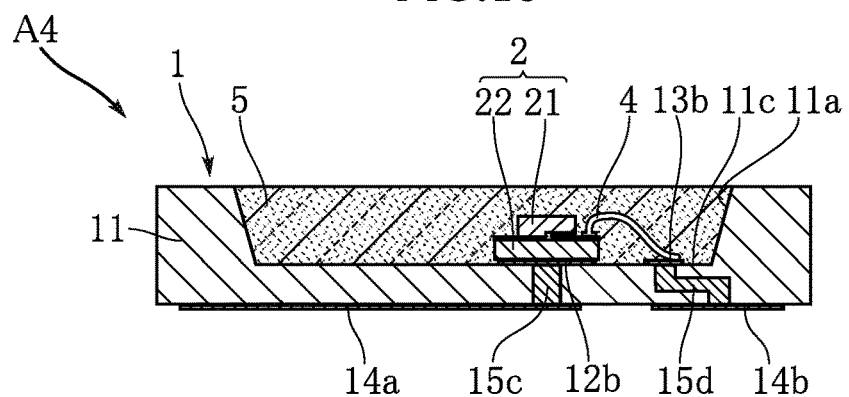
FIG. 15 is a sectional view taken along lines XV-XV in FIG. 14.
Figure 16:
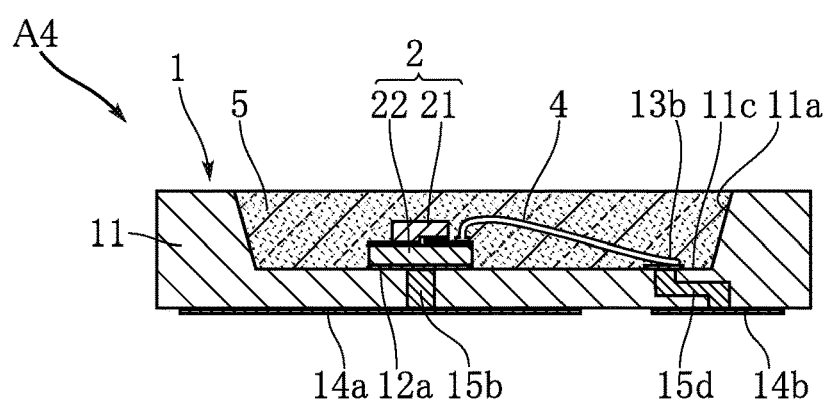
FIG. 16 is a sectional view taken along lines XVI-XVI in FIG. 14.

The size of each pad 12a, 12b as viewed in plan is smaller than that of each LED chip 21. As shown in FIG. 13, the outer edge 121b of each pad 12b is positioned slightly inward of the outer edge 2a of the LED unit 2 (LED chip 21) as viewed in plan.

According to this embodiment again, reduction of light emission amount of the LED module A3 with time is suppressed, and the LED module A3 offers high brightness.

FIGS. 14-17 show an LED module according to a fourth embodiment of the present invention. The LED module A4 of this embodiment is different from the foregoing embodiments in structure of the LED units 2. In this embodiment, each LED unit 2 is made up of an LED chip 21 and a sub-mount substrate 22 and structured as a single-wire LED unit.

The sub-mount substrate 22 is made of e.g. Si, and the LED chip 21 is mounted on the sub-mount substrate. The sub-mount substrate 22 has a wiring pattern formed on it via an insulating film. The wiring pattern is electrically connected to an electrode (not shown) of the LED chip 21, and includes a portion extending into a region that is not covered by the LED chip 21. In this embodiment, a wire 4 is bonded to the wiring pattern. The sub-mount substrate 22 is made a conductor by e.g. doping. Another electrode (not shown) of the LED chip 21 is held in contact with and electrically connected to the sub-mount substrate 22. The sub-mount substrate 22 is bonded to the pad 12a or 12b with e.g. Ag paste 17. This bonding may be performed by eutectic bonding.

Figure 17:
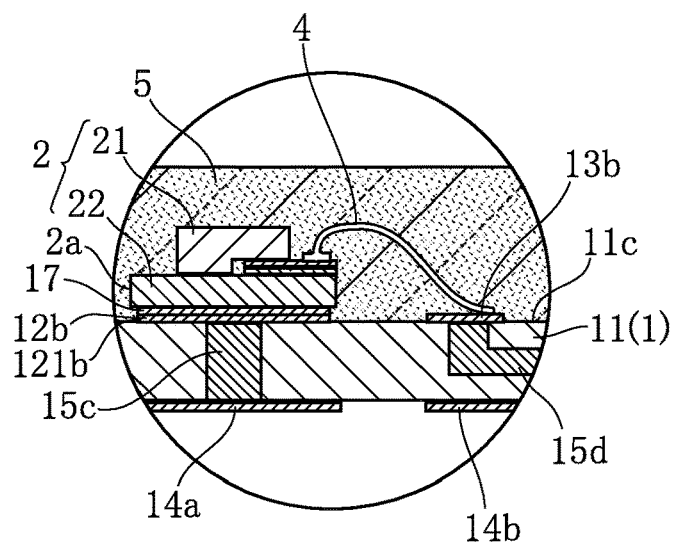
FIG. 17 is an enlarged sectional view of a principal portion of the LED module according to the fourth embodiment of the present invention.

In this embodiment again, the size of each pad 12a, 12b as viewed in plan is smaller than that of the sub-mount substrate 22. As shown in FIG. 17, the outer edge 121b of each pad 12b is positioned slightly inward of the outer edge 2a of the LED unit 2 (sub-mount substrate 22) as viewed in plan.

According to this embodiment again, reduction of light emission amount of the LED module A4 with time is suppressed, and the LED module A4 offers high brightness.

Figure 18:
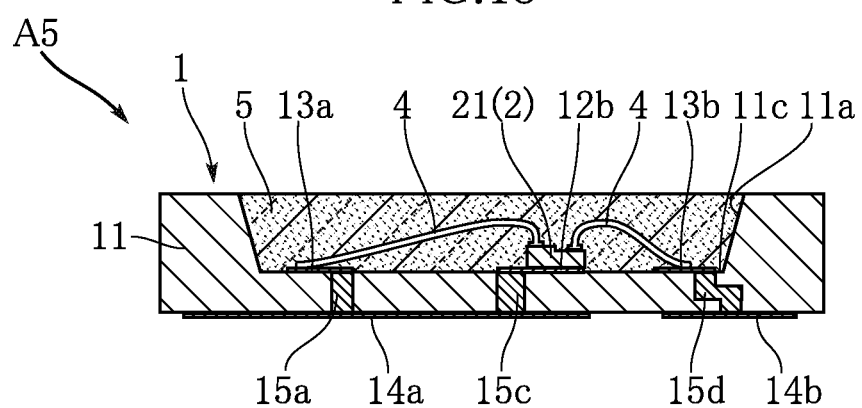
FIG. 18 is a sectional view showing an LED module according to a fifth embodiment of the present invention.
Figure 19:
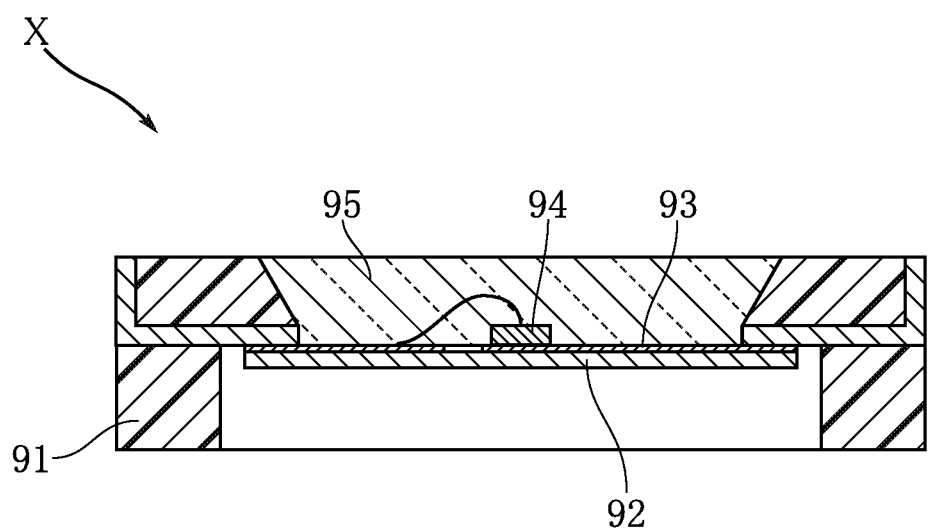
FIG. 19 is a sectional view showing an example of a conventional LED module.

FIG. 18 shows an LED module according to a fifth embodiment of the present invention. The LED module A5 of this embodiment has the same structure as that of the LED module A1 except that the structure of the penetration conductors 15a, 15b, 15c, 15d are different. Though penetration conductor 15b is not shown in this figure, the penetration conductor 15b has the same structure as that of the penetration conductor 15c.

In this embodiment, the penetration conductor 15c is provided at a position that avoids the LED unit 2 (LED chip 21) as viewed in plan. The pad 12b and the penetration conductor 15c are electrically connected to each other via a plated layer extending from the pad 12b. The penetration conductors 15a, 15d are provided at positions that avoid bonded portions of the wires as viewed in plan.

According to this embodiment again, reduction of light emission amount of the LED module A5 with time is suppressed, and the LED module A5 offers high brightness.

The LED module according to the present invention is not limited to the foregoing embodiments. The specific structure of each part of the LED module according to the present invention can be varied in design in many ways.

The plurality of LED chips 21 may emit light of different wavelengths. The shape of the bottom surface 11c is not limited to a circular shape. The light-transmitting portion 5 may be made of a transparent material only.

The invention claimed is:

1. An LED module comprising:
at least one LED chip;
a penetration conductor connected to the LED chip; and
a case formed with an accommodation space that accommodates the LED chip,
wherein the case comprises a base portion supporting the LED chip and a reflecting portion formed integral with the base portion, the reflecting portion surrounding the LED chip in plan view, the accommodation space being defined by the base portion and the reflecting portion,
the base portion and the reflecting portion are made of a same ceramic material,
the penetration conductor comprises a first end, a second end, and an intermediate portion connecting the first end and the second end, and each of the first end, the second end, and the intermediate portion is embedded within the base portion,
the LED module further comprising a wire and a mounting electrode,
wherein the penetration conductor is disposed at a position that does not overlap with the LED chip in plan view, the penetration conductor extending through the base portion of the case,
the wire electrically connects the LED chip and the penetration conductor to each other, and
the mounting electrode is disposed opposite to the LED chip with respect to the base portion of the case and is connected to the penetration conductor.

2. The LED module according to claim 1, wherein the base portion comprises a first surface and a second surface that are spaced apart from each other in a thickness direction of the base portion, the first surface facing the accommodation space,
the intermediate portion of the penetration conductor is elongated in parallel to the first surface of the base portion.

3. The LED module according to claim 2, wherein an entirety of the intermediate portion of the penetration conductor is embedded in the base portion.

4. The LED module according to claim 2, wherein the first end of the penetration conductor has an end face flush with the first surface of the base portion, and the second end of the penetration conductor has an end face flush with the second surface of the base portion.

5. The LED module according to claim 2, wherein the second end of the penetration conductor is disposed at a position that overlaps with the reflecting portion in plan view.

6. The LED module according to claim 1, further comprising a conductive pad disposed in the accommodation space,
wherein the at least one LED chip comprises a first LED chip and a second LED chip that are spaced apart from each other in plan view, the first LED chip and the second LED chip being electrically connected to the conductive pad in common.

7. The LED module according to claim 6, wherein the first LED chip and the second LED chip are configured to emit blue light.

8. The LED module according to claim 6, wherein a distance between the first LED chip and the conductive pad is different from a distance between the second LED chip and the conductive pad.

9. The LED module according to claim 6, further comprising an active element for protection of the first LED chip and the second LED chip, wherein the active element is electrically connected to the conductive pad.

10. The LED module according to claim 1, further comprising a light-transmitting portion filled in the accommodation space and covering the LED chip.

11. The LED module according to claim 10, wherein the light-transmitting portion comprises a resin material and a fluorescent substance mixed in the resin material.

12. An LED module comprising:
at least one LED chip; and
a case formed with an accommodation space that accommodates the LED chip,
wherein the case comprises a base portion supporting the LED chip and a reflecting portion formed integral with the base portion, the reflecting portion surrounding the LED chip in plan view, the accommodation space being defined by the base portion and the reflecting portion,
the base portion and the reflecting portion are made of a same ceramic material,
the LED module further comprising a first penetration conductor, a second penetration conductor, a first wire, and a first mounting electrode,
wherein the first penetration conductor is disposed at a position that overlaps with the LED chip in plan view, the first penetration conductor extending through the base portion of the case,
the second penetration conductor is disposed at a position that does not overlap with the LED chip in plan view, the second penetration conductor extending through the base portion of the case,
the first wire electrically connects the LED chip and the second penetration conductor to each other,
the first mounting electrode is disposed opposite to the LED chip with respect to the base portion of the case and is connected to the first penetration conductor and the second penetration conductor in common,
the LED module further comprising a third penetration conductor, a second wire, and a second mounting electrode,
wherein the third penetration conductor is disposed at a position that does not overlap with the LED chip in plan view, the third penetration conductor extending through the base portion of the case,
the second wire electrically connects the LED chip and the third penetration conductor to each other,
the second mounting electrode is disposed opposite to the LED chip with respect to the base portion of the case and is connected to the third penetration conductor.

13. The LED module according to claim 12, wherein the first penetration conductor and the LED chip are electrically insulated from each other.

14. The LED module according to claim 13, wherein the first penetration conductor conducts heat generated at the LED chip to the first mounting electrode.

15. The LED module according to claim 12, wherein the first penetration conductor is greater in volume than the second penetration conductor.

16. The LED module according to claim 12, wherein the first wire and the second wire have mutually different lengths.

17. The LED module according to claim 12, wherein the at least one LED chip comprises a plurality of LED chips disposed at positions, respectively, that overlap with the first mounting electrode in plan view.

18. The LED module according to claim 17, wherein the plurality of LED chips are arranged along mutually parallel lines.

* * * * *